US010218927B2

United States Patent
Kwag et al.

(10) Patent No.: US 10,218,927 B2
(45) Date of Patent: Feb. 26, 2019

(54) IMAGE SENSOR HAVING SHARED PIXEL STRUCTURE WITH SYMMETRICAL SHAPE RESET TRANSISTORS AND ASYMMETRICAL SHAPE DRIVER TRANSISTORS

(71) Applicant: SK hynix Inc., Icheon-Si (KR)

(72) Inventors: Pyong-Su Kwag, Eumseong-gun (KR); Hye-Won Mun, Anyang-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/877,811

(22) Filed: Jan. 23, 2018

(65) Prior Publication Data

US 2019/0007633 A1    Jan. 3, 2019

(30) Foreign Application Priority Data

Jul. 3, 2017    (KR) .................. 10-2017-0084222

(51) Int. Cl.
| | | |
|---|---|---|
| *H01L 27/146* | (2006.01) | |
| *H04N 5/365* | (2011.01) | |
| *H04N 5/378* | (2011.01) | |
| *H04N 9/04* | (2006.01) | |
| *H04N 9/07* | (2006.01) | |

(52) U.S. Cl.
CPC ....... *H04N 5/365* (2013.01); *H01L 27/14605* (2013.01); *H01L 27/14612* (2013.01); *H04N 5/378* (2013.01); *H04N 9/045* (2013.01); *H04N 9/07* (2013.01); *H04N 2209/042* (2013.01)

(58) Field of Classification Search
CPC ........ H01L 27/14605; H01L 27/14612; H04N 5/365
See application file for complete search history.

(56) References Cited

U.S. PATENT DOCUMENTS

| | | | |
|---|---|---|---|
| 9,165,959 B2 | 10/2015 | Chen et al. | |
| 9,406,707 B2 | 8/2016 | Yamakawa | |
| 2003/0160295 A1* | 8/2003 | Okita | ................ H01L 27/14609 257/506 |
| 2008/0035963 A1* | 2/2008 | Kwon | ............... H01L 27/14603 257/291 |

* cited by examiner

*Primary Examiner* — Andrew Q Tran
(74) *Attorney, Agent, or Firm* — Perkins Coie LLP

(57) ABSTRACT

An image sensor includes a pixel array including a plurality of pixel blocks, each including a light receiving section including unit pixels which share a floating diffusion; a first driving section disposed at one side of the light receiving section and including a reset transistor; and a second driving section disposed adjacent to the first driving section and including a driver transistor, wherein the pixel blocks include a first pixel block and a second pixel block which is adjacent to the first pixel block, and, with respect to a boundary where the first pixel block and the second pixel adjoin each other, the first driving section of the first pixel block has a shape symmetrical to the first driving section of the second pixel block and the second driving section of the first pixel block has a shape asymmetrical to the second driving section of the second pixel block.

20 Claims, 6 Drawing Sheets

IMAGE SENSOR HAVING SHARED PIXEL STRUCTURE WITH SYMMETRICAL SHAPE RESET TRANSISTORS AND ASYMMETRICAL SHAPE DRIVER TRANSISTORS

CROSS-REFERENCE TO RELATED APPLICATION

This patent document claims the priority and benefits of Korean Patent Application No. 10-2017-0084222 filed on Jul. 3, 2017 in the Korean Intellectual Property Office, the disclosure of which is incorporated herein by reference in its entirety.

TECHNICAL FIELD

Various embodiments generally relate to a semiconductor device fabrication technology, and more particularly, to an image sensor having a shared pixel structure.

BACKGROUND

An image sensor is a device which receives light from an optical image or one or more objects and converts the received light into electrical signals forming an image. Recently, with the development of the computer industry and communication industry, the demand for an image sensor having improved performance is increasing in various fields or applications, including, e.g., a digital camera, a camcorder, a portable device such as a personal communication system, a game machine, a security camera, a medical micro-camera and a robot.

SUMMARY

Various embodiments are directed to an image sensor with improved performance.

In an embodiment, an image sensor may include: a pixel array in which a plurality of pixel blocks are arranged, each of the plurality of pixel blocks including a light receiving section including a plurality of unit pixels which share a floating diffusion; a first driving section disposed at one side of the light receiving section and including a reset transistor; and a second driving section disposed adjacent to the first driving section and including a driver transistor, wherein the plurality of pixel blocks include a first pixel block and a second pixel block which is adjacent to the first pixel block, and, with respect to a boundary where the first pixel block and the second pixel adjoin each other, the first driving section of the first pixel block has a shape symmetrical to the first driving section of the second pixel block and the second driving section of the first pixel block has a shape asymmetrical to the second driving section of the second pixel block.

The first driving section of the first pixel block and the first driving section of the second pixel block are arranged closer to the boundary than the second driving section of the first pixel block and the second driving section of the second pixel block, respectively, and the image sensor may further include: a pickup region positioned between the first driving section of the first pixel block and the first driving section of the second pixel block and supplied with a ground voltage. Drains of reset transistors which are supplied with a reset voltage are positioned at both sides, respectively, of the pickup region.

The first driving section of the first pixel block and the first driving section of the second pixel block are positioned adjacent to each other, and are structured to share a drain for reset transistors which is supplied with a reset voltage. The image sensor may further include: pickup regions positioned adjacent to the second driving section of the first pixel block and the second driving section of the second pixel block, respectively, and supplied with a ground voltage, the pickup regions being adjacent to drains of driver transistors supplied with a driver voltage.

Each of the plurality of pixel blocks may further include: an intercoupling section disposed to electrically couple the floating diffusion and a source of the reset transistor and electrically couplie the floating diffusion and a gate of the driver transistor. A contact between the gate of the driver transistor and the intercoupling section is formed within a predetermined range and as far as possible from a drain of the driver transistor which is supplied with a driver voltage. In each of the plurality of pixel blocks, the source of the reset transistor which is coupled with the intercoupling section is positioned inside a drain of the reset transistor which is supplied with a reset voltage.

Pixel blocks positioned on oblique lines crossing the first pixel block may have the same planar shape as the first pixel block, and wherein pixel blocks positioned on oblique lines crossing the second pixel block may have the same planar shape as the second pixel block.

In an embodiment, an image sensor may include: a pixel array in which a plurality of pixel blocks are arranged, each of the plurality of pixel blocks comprising: a light receiving section including a plurality of unit pixels which share a floating diffusion; a first driving section disposed at one side of the light receiving section and including a reset transistor; and a second driving section disposed adjacent to the first driving section and including a driver transistor, wherein the plurality of pixel blocks include a first pixel block, a second pixel block which is adjacent to the first pixel block in a first direction, and a third pixel block and a fourth pixel block which are adjacent to the first pixel block and the second pixel block, respectively, in a second direction intersecting with the first direction, wherein, with respect to a first boundary where the first pixel block and the second pixel block adjoin each other, the first driving section of the first pixel block has a shape symmetrical to the first driving section of the second pixel block and is positioned adjacent to the first driving section of the second pixel block, and wherein, with respect to a second boundary where the third pixel block and the fourth pixel block adjoin each other, the second driving section of the third pixel block has a shape asymmetrical to the second driving section of the fourth pixel block and is positioned adjacent to the second driving section of the fourth pixel block.

The image sensor, wherein, with respect to the first boundary, the second driving section of the first pixel block may have a shape asymmetrical to the second driving section of the second pixel block, and wherein, with respect to the second boundary, the first driving section of the third pixel block may have a shape symmetrical to the first driving section of the fourth pixel block.

The image sensor may further include: a pickup region positioned between the first driving section of the first pixel block and the first driving section of the second pixel block, and supplied with a ground voltage. Drains of reset transistors which are supplied with a reset voltage are positioned at both sides, respectively, of the pickup region.

The first driving section of the first pixel block and the first driving section of the second pixel block are structured to share a drain for reset transistors which is supplied with a reset voltage. The image sensor may further include: pickup regions positioned adjacent to the second driving section of the first pixel block and the second driving section of the second pixel block, respectively, and supplied with a ground voltage, the pickup regions being adjacent to drains of driver transistors which are supplied with a driver voltage.

Each of the plurality of pixel blocks may further include: an intercoupling section disposed to electrically couple the floating diffusion and a source of the reset transistor and electrically couple the floating diffusion and a gate of the driver transistor. A contact between the gate of the driver transistor and the intercoupling section is formed within a predetermined range and as far as possible from a drain of the driver transistor which is supplied with a driver voltage. In each of the plurality of pixel blocks, the source of the reset transistor which is coupled with the intercoupling section is positioned inside a drain of the reset transistor which is supplied with a reset voltage.

Pixel blocks positioned on oblique lines crossing the first pixel block may have the same planar shape as the first pixel block, and wherein pixel blocks positioned on oblique lines crossing the second pixel block may have the same planar shape as the second pixel block. The planar shape of the first pixel block may be the same as the planar shape of the fourth pixel block, and the planar shape of the second pixel block may be the same as the planar shape of the third pixel block.

According to the embodiments, between two pixel blocks disposed adjacent to each other, first driving sections including reset transistors, respectively, have symmetrical shapes and second driving sections including driver transistors, respectively, have asymmetrical shapes. As a consequence, it is possible to prevent noise generation and characteristic deterioration due to a shared pixel structure.

DETAILED DESCRIPTION

The disclosed image sensing technology can be implemented to provide an electronic device including an image sensor that can prevent noise generation and characteristic deterioration due to a shared pixel structure.

The following embodiments provide an image sensor with improved performance. In some implementations, an image sensor may have a shared pixel structure to improve the degree of integration. One embodiment of the disclosed technology is to provide an image sensor capable of preventing characteristic deterioration due to noise generated by a shared pixel structure. For reference, noise generated by a shared pixel structure may include temporary noise and fixed pattern noise (FPN). Temporary noise may occur due to a reduction in the size of a pixel transistor, in particular, a reduction in the area of a channel, by an increase in the degree of integration of an image sensor. Also, temporary noise may occur due to interference between a pixel transistor and an adjacent structure. Around the unit pixels sharing a floating diffusion, various types and shapes of structures, for example, conductive lines and pixel transistors, are disposed, which result in differences in overlap capacitance and/or parasitic capacitance of the unit pixels. Fixed pattern noise may occur due to such differences in overlap capacitance and/or parasitic capacitance.

In order to prevent characteristic deterioration due to temporary noise and fixed pattern noise in an image sensor having a shared pixel structure, one implementation of the disclosed technology provides an image sensor in which reset transistors have symmetrical shapes and driver transistors have asymmetrical shapes between two pixel blocks disposed adjacent to each other.

In embodiments of the disclosed technology that are described below, a first direction D1 may be a left-right direction or a row direction, and a second direction D2 may be a column direction or an up-down direction. A third direction D3 and a fourth direction D4 intersecting with each other may be oblique directions. While it is illustrated in the embodiment of the disclosed technology that the first direction D1 and the second direction D2 are a row direction and a column direction, respectively, it is to be noted that the present disclosure is not limited thereto. That is to say, in some implementations, it is also possible that the first direction D1 may be a column direction, and the second direction D2 may be a row direction.

Figure 1:
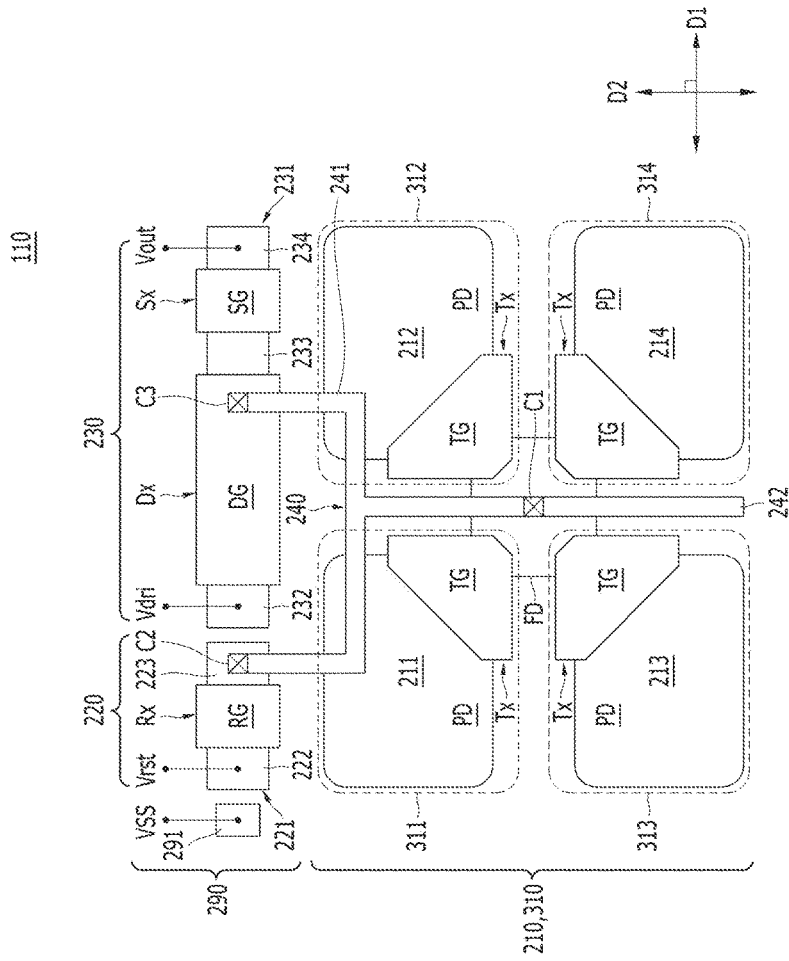
FIG. 1 is a top view illustrating a representation of an example of a pixel block of an image sensor and a color pattern corresponding to the pixel block in accordance with an embodiment of the disclosed technology.
Figure 2:
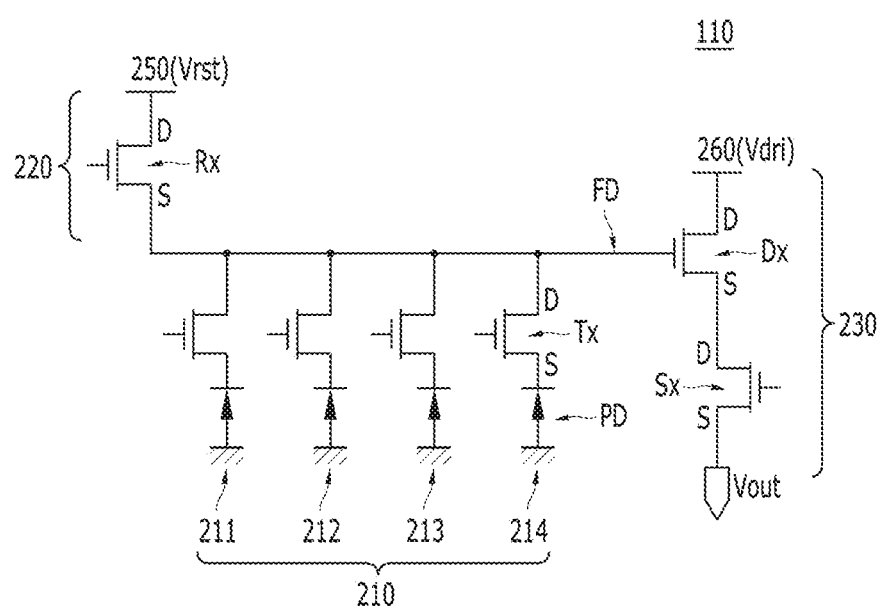
FIG. 2 is an equivalent circuit diagram corresponding to the pixel block of the image sensor in accordance with an embodiment of the disclosed technology.

FIG. 1 is a top view illustrating a representation of an example of a pixel block of an image sensor and a color pattern corresponding to the pixel block in accordance with an embodiment. FIG. 2 is an equivalent circuit diagram corresponding to the pixel block of the image sensor in accordance with the embodiment.

As shown in FIGS. 1 and 2, the image sensor in accordance with the embodiment may include a pixel block 110 which has a shared pixel structure. The pixel block 110 may include a light receiving section 210 which generates photocharges in response to incident light, a driving circuit 290 which generates and outputs an output signal Vout corresponding to the photocharges generated by the light receiving section 210, and an intercoupling section 240 which electrically couples the light receiving section 210 and the driving circuit 290. While it is illustrated in the present embodiment that the pixel block 110 includes one light receiving section 210 and one driving circuit 290, it is to be noted that the present disclosure is not limited thereto. As a modification, the pixel block 110 may include at least two light receiving sections 210, and at least two light receiving sections 210 may share one driving circuit 290. Also, as another modification, the pixel block 110 may include at least two light receiving sections 210 and at least two driving circuits 290, and at least two light receiving sections 210 may share at least two driving circuits 290. As such, the number of light receiving sections 210 and the number of driving circuits 290 that are included in the pixel block 110 can be modified in various manners.

In the pixel block 110 of the image sensor based on one implementation of the disclosed technology, the light receiving section 210 may include a plurality of unit pixels which are arranged in an m×n (m and n are natural numbers) matrix structure and share a floating diffusion FD. For example, the light receiving section 210 may have a 4-shared pixel structure which includes four unit pixels 211 to 214, that is, a first unit pixel 211 to a fourth unit pixel 214, arranged in a 2×2 matrix structure. While it is illustrated in the embodiment that the light receiving section 210 has a 4-shared pixel structure, it is to be noted that the present disclosure is not limited thereto. As a modification, the light receiving section 210 may have a 2n (n is a natural number)-shared pixel structure.

In the light receiving section 210, the floating diffusion FD may be positioned at the center, and the first unit pixel 211 to the fourth unit pixel 214 may be disposed to surround the floating diffusion FD. In some implementations of the light receiving section 210, the first unit pixel 211, the second unit pixel 212, the third unit pixel 213 and the fourth unit pixel 214 may be positioned at a left upper end, a right upper end, a left lower end and a right lower end, respectively. Each of the first unit pixel 211 to the fourth unit pixel 214 may include a photoelectric conversion element PD which generates photocharges in response to incident light and a transfer transistor Tx which transfers the photocharges generated in the photoelectric conversion element PD, to the floating diffusion FD in response to a transfer signal. The photoelectric conversion element PD may include a photodiode, a phototransistor, a photogate, or a pinned photodiode (PPD), or any combinations thereof. For example, the photoelectric conversion element PD may include organic or/and inorganic photodiodes. In some implementations, the photoelectric conversion element PD may be configured by any one of organic and inorganic photodiodes or may be configured in a form in which an organic photodiode and an inorganic photodiode are stacked. The transfer signal may be applied to a transfer gate TG, and the photoelectric conversion element PD and the floating diffusion FD may serve as a source S and a drain D, respectively, of the transfer transistor Tx.

In the pixel block 110 of the image sensor in accordance with the embodiment, the driving circuit 290 may be positioned at one side of the light receiving section 210. For example, one side of the light receiving section 210 may be the top of the light receiving section 210 as shown in FIG. 1. The location of the driving circuit 290 is not limited to the top of the light receiving section 210. For example, the driving circuit 290 may be positioned on the right side of the light receiving section 210.

Figure 3:
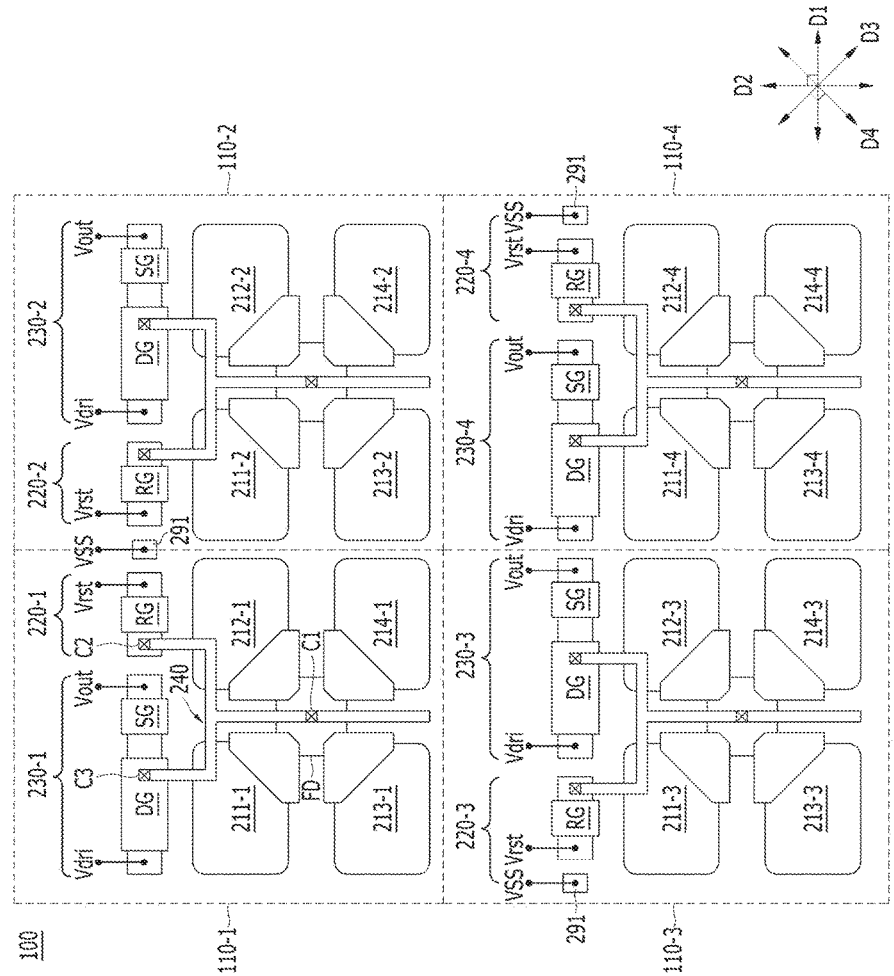
FIG. 3 is a top view illustrating a representation of an example of a portion of a pixel array of an image sensor in accordance with a first embodiment of the disclosed technology.
Figure 4:
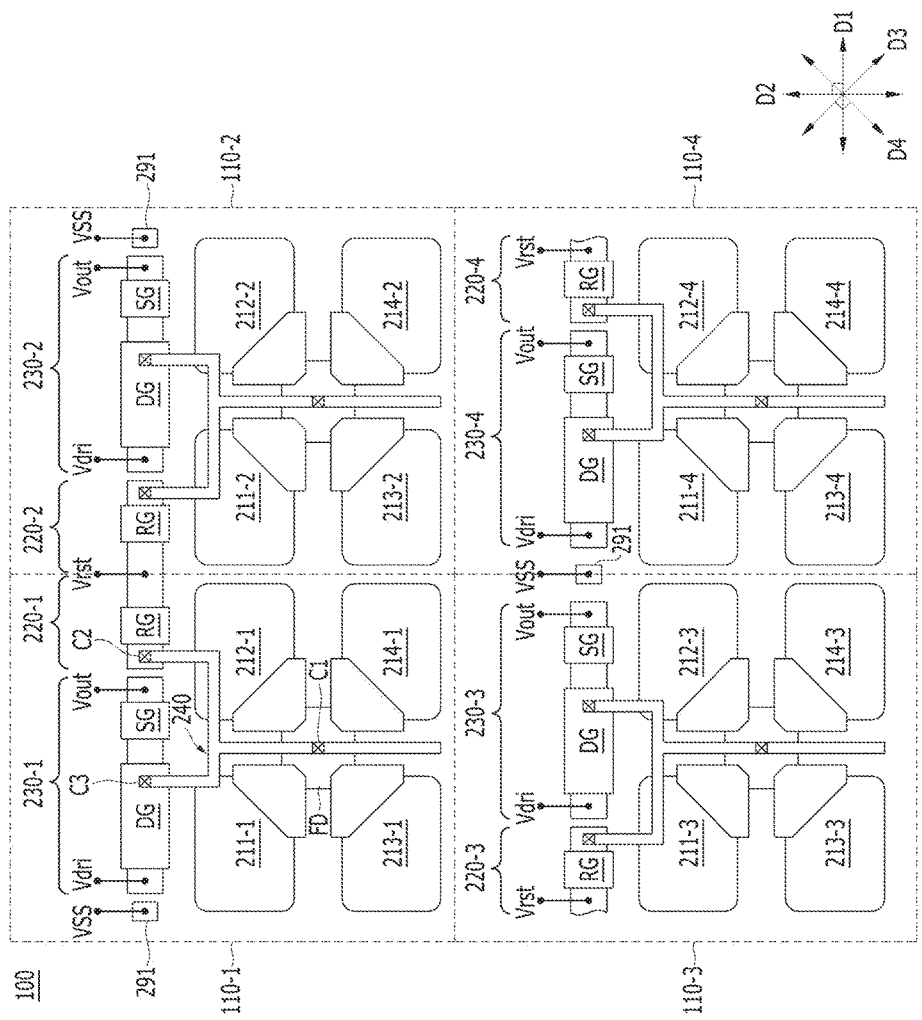
FIG. 4 is a top view illustrating a representation of an example of a portion of a pixel array of an image sensor in accordance with a second embodiment of the disclosed technology.

The driving circuit 290 may include a first driving section 220 which includes a reset transistor Rx, a second driving section 230 which is adjacent to the first driving section 220 and includes a driver transistor Dx, and a pickup region 291. For reference, while it is illustrated in FIG. 1 that the second driving section 230 is positioned at the right side of the first driving section 220, it is to be noted that the second driving section 230 may be positioned at the left side of the first driving section 220 as shown in FIGS. 3 and 4. Further, while it is illustrated in FIG. 1 that the pickup region 291 is positioned adjacent to the first driving section 220, it is to be noted that the pickup region 291 may be positioned adjacent to the driver transistor Dx as shown in FIG. 4.

The first driving section 220 may include the reset transistor Rx. The reset transistor Rx may initialize the floating diffusion FD and the photoelectric conversion element PD of the light receiving section 210 in response to a reset signal. The reset signal can be supplied to the reset gate RG in various manners. For example, the reset signal is generated by the row driver, which appears in FIG. 5 as the reference number 150, and supplied to the reset gate RG through a row line extending from the row driver 150 (see FIG. 5) to the reset gate RG. The reset transistor Rx may include a first active region 221, a reset gate RG which is formed on the first active region 221, and a first junction region 222 and a second junction region 223 which are formed in the first active region 221 at both sides of the reset gate RG. The first active region 221 may have a bar type shape which has a major axis and a minor axis and in which the major axis extends in the first direction D1. The reset signal may be applied to the reset gate RG. The first junction region 222 may operate as a drain D of the reset transistor Rx. The first junction region 222 provides the reset transistor Rx with a reset voltage Vrst. To provide the reset voltage Vrst, the first junction region 222 may be coupled to a reset voltage supply node 250 (see FIG. 2). The reset voltage Vrst may be a positive voltage. For example, the reset voltage Vrst may be a power supply voltage (VDD) or a positive voltage greater than the power supply voltage (VDD). The second junction region 223 may operate as a source S of the reset transistor Rx. The second junction region 223 may be electrically coupled with the intercoupling section 240 through a second contact C2. The second junction region 223 may be electrically coupled with the floating diffusion FD of the light receiving section 210 through the intercoupling section 240.

The first junction region 222 and the second junction region 223 can be arranged in the pixel block 110 or the first driving section 220 in a way to minimize overlap capacitance due to the presence of the intercoupling section 240. For example, in the pixel block 110 or the first driving section 220, the second junction region 223 may be positioned further inside than the first junction region 222. For example, the source S of the reset transistor Rx may be positioned further inside than the drain D of the reset transistor Rx from an outer boundary of the pixel block. For reference, the effective capacitance of the floating diffusion FD can be reduced to minimize overlap capacitance due to the presence of the intercoupling section 240 electrically coupled to the floating diffusion FD. Through this, conversion gain may be improved.

The second driving section 230 may generate the output signal Vout corresponding to the photocharges generated by the light receiving section 210, and output the output signal Vout to a column line (not shown) in response to a select signal applied through a row line (not shown). To this end, the second driving section 230 may include the driver transistor Dx and a selection transistor Sx. For reference, while it is illustrated in FIG. 1 that the selection transistor Sx is positioned at the right side of the driver transistor Dx, it is to be noted that the selection transistor Sx may be positioned at the left side of the driver transistor Dx (see FIGS. 3 and 4).

The driver transistor Dx and the selection transistor Sx may share a second active region 231 and may include a driver gate DG and a selection gate SG, respectively, which are formed on the second active region 231. The second active region 231 may have a bar type shape which has a major axis and a minor axis and in which the major axis extends in the first direction D1. The driver gate DG may have a size larger than the reset gate RG and the selection gate SG to improve a noise characteristic. That is to say, the channel area of the driver transistor Dx may be larger than the reset transistor Rx and the selection transistor Sx. The driver gate DG may be electrically coupled with the floating diffusion FD through the intercoupling section 240. The row line may be coupled to the selection gate SG. Junction regions may be formed in the second active region 231 at both sides of the driver gate DG and the selection gate SG. A third junction region 232 may be formed in the second active region 231 at one side of the driver gate DG. A fourth junction region 233 may be formed in the second active region 231 at the other side of the driver gate DG, that is, between the driver gate DG and the selection gate SG. A fifth junction region 234 may be formed in the second active region 231 at the other side of the selection gate SG.

The third junction region 232 may operate as a drain D of the driver transistor Dx. The driver transistor Dx may be applied with a driver voltage Vdri through the third junction region 232. In other words, the third junction region 232 may be coupled to a driver voltage supply node 260. The driver voltage Vdri may have a positive value. For example, the driver voltage Vdri may be the power supply voltage (VDD) or a positive voltage larger than the power supply voltage (VDD). The fourth junction region 233 may operate as a source S of the driver transistor Dx and a drain D of the selection transistor Sx. The fifth junction region 234 may operate a source S of the selection transistor Sx. The fifth junction region 234 may be coupled to the column line, and the output signal Vout may be transferred to the column line through the fifth junction region 234.

In order to maximally prevent the interference between the third junction region 232 which is applied with the driver voltage Vdri and the intercoupling section 240 which is electrically coupled to the driver gate DG through a third contact C3, the third contact C3 may be positioned to be separated from the third junction region 232 as much as possible while the third contact C3 is still within a predetermined range. The predetermined range indicates a region where the third contact C3 can be formed and may include the top surface region of the driver gate DG. In some implementations, the third contact C3 may be formed adjacent to the fourth junction region 233. In some implementations, the third contact C3 may be formed to be more adjacent or closer to the source S of the driver transistor Dx than the drain D of the driver transistor Dx. Through this, it is possible to effectively prevent or reduce the generation of temporary noise.

While it is illustrated in the present embodiment that the second driving section 230 includes the driver transistor Dx and the selection transistor Sx, it is to be noted that other implementations are also possible. For example, as a modification, the second driving section 230 may include only the driver transistor Dx.

The pickup region 291 is to provide reference potential for the pixel block 110. For example, a predetermined voltage, for example, a ground voltage VSS, may be applied to a substrate where the pixel block 110 is formed, through the pickup region 291. As the reference potential, for example, the ground voltage VSS, is provided to the pixel block 110 through the pickup region 291, the operational stability of the pixel block 110 may be improved. In order to effectively improve the operational stability of the pixel block 110, the pickup region 291 may be positioned to be adjacent to the drain D of the reset transistor Rx, that is, the first junction region 222. This is because the reset voltage Vrst having a magnitude equal to or higher than the power supply voltage (VDD) is applied to the first junction region 222. The power supply voltage (VDD) or a positive voltage greater than the power supply voltage (VDD) may cause deterioration of the characteristics of a pixel transistor and a unit pixel which are adjacent to the first junction region 222, by an electric field effect. By locating the pickup region 291 to be adjacent to the first junction region 222 of the reset transistor Rx, the electric field effect can be alleviated. The pickup region 291 which is located adjacent to the first junction region 222 to which the reset voltage is supplied can provide a more stable reference voltage since the variation of the reset voltage becomes lower. Thus, the stable reference voltage can insure the uniform operations of the device and avoid or reduce noises. Meanwhile, although not shown in the drawing, the pickup region 291 may be positioned to be adjacent to the drain D of the driver transistor Dx, that is, the third junction region 232 (see FIG. 4). This is because the driver voltage Vdri, which is applied to the third junction region 232, also has a magnitude equal to or higher than the power supply voltage (VDD). Thus, by locating the pixel region 291 to be adjacent to the third junction region 232, the electric field effect that deteriorates the characteristics of the pixel transistor and the unit pixel can be also alleviated. Thus, the pickup region 291 may be positioned to be adjacent to the drain D of the reset transistor Rx to which the reset voltage Vrst is applied or the drain D of the driver transistor Dx to which the driver voltage Vdri is applied. Through this, the operational stability of the pixel block 110 may be improved, and at the same time, the electric field effect due to the reset voltage Vrst or the driver voltage Vdri can be alleviated.

The pickup region 291 may be positioned outermost in the pixel block 110. This is to ensure that, in a pixel array 100 in which a plurality of pixel blocks 110 are arranged, adjacent pixel blocks 110 are formed to easily share a pickup region 291 (see FIGS. 3 and 4). In this way, as adjacent pixel blocks 110 share a pickup region 291, it is possible to increase the size of pixel transistors, in particular, the channel area of pixel transistors, within a limited area. Through this, the characteristics of pixel transistors may be improved, and characteristic dispersions due to process variations may be reduced. As a result, it is possible to effectively prevent the generation of temporary noise.

The intercoupling section 240 may play the role of electrically coupling the light receiving section 210 and the first driving section 220 and electrically coupling the light receiving section 210 and the second driving section 230. In detail, the intercoupling section 240 may be electrically coupled with the floating diffusion FD of the light receiving section 210 through a first contact C1. The intercoupling section 240 may be electrically coupled to the source S of the reset transistor Rx of the first driving section 220, that is, the second junction region 223, through the second contact C2. Furthermore, the intercoupling section 240 may be electrically coupled with the driver gate DG of the second driving section 230 through the third contact C3.

The intercoupling section 240 may include a conductive region 241 and a dummy region 242 which are positioned at different sides of the first contact C1 by which the intercoupling section 240 is coupled with the floating diffusion FD. For example, the conductive region 241 and the dummy region 242 are positioned at opposite sides of the first contact C1 along the second direction D2. The conductive region 241 couples the light receiving section 210 with the first driving section 220 and the second driving section 230. The dummy region 242 is configured to balance overlap capacitance between the respective unit pixels 211 to 214 and the intercoupling section 240. The dummy region 242 may have a line type shape which extends from the first contact C1 in the second direction D2 between the third unit pixel 213 and the fourth unit pixel 214. Also, although not shown in the drawing, the dummy region 242 of the intercoupling section 240 may have a symmetrical shape with respect to the conductive region 241 in the second direction D2 when viewed from the first contact C1. Since the intercoupling section 240 includes the dummy region 242, characteristic deterioration due to fixed pattern noise can be remedied.

The pixel block 110 of the image sensor in accordance with the embodiment may include a corresponding color pattern 310. The color pattern 310 may include a plurality of color filters corresponding to the plurality of unit pixels 211 to 214, respectively, of the pixel block 110. For reference, in FIG. 1, the plurality of color filters are illustrated by dotted lines. Each of the plurality of color filters may be configured to include any one or two more of a red filter, a green filter, a blue filter, a cyan filter, a yellow filter, a magenta filter, a white filter, a black filter, an IR cutoff filter, an IR pass filter, or a band pass filter which passes a specific wavelength band. In some implementations, the color filter may operate as a single filter or a multi-filter. For example, the color pattern 310 may include a first color filter 311 to a fourth color filter 314 corresponding to the first unit pixel 211 to the fourth unit pixel 214, respectively. In some implementations, the color pattern 310 may be configured as a Bayer pattern in which the first color filter 311 and the fourth color filter 314 are green filters, and the second color filter 312 and the third color filter 313 are a red filter and a blue filter, respectively.

Meanwhile, although not shown in the drawing, in order to prevent characteristic deterioration due to fixed pattern noise, all of the first color filter 311 to the fourth color filter 314 may have the same color. Also, as a modification, the first color filter 311 and the second color filter 312 which are adjacent in the first direction D1 may have the same color, and the third color filter 313 and the fourth color filter 314 which are adjacent in the first direction D1 may have the same color. In this regard, the first color filter 311 and the third color filter 313 may have different colors. Moreover, as another modification, the first color filter 311 and the third color filter 313 which are adjacent in the second direction D2 may have the same color, and the second color filter 312 and the fourth color filter 314 which are adjacent in the second direction D2 may have the same color. In this regard, the first color filter 311 and the second color filter 312 may have different colors.

Hereinbelow, the disposition of pixel blocks 110 each including the pixel block 110 in accordance with the embodiment and capable of effectively preventing noise generation and characteristic deterioration due to a shared pixel structure will be described in detail with reference to drawings.

FIG. 3 is a top view illustrating a representation of an example of a portion of a pixel array of an image sensor in accordance with a first embodiment.

Referring to FIGS. 1 to 3, the image sensor in accordance with the first embodiment may include a pixel array 100 in which a plurality of pixel blocks 110 are arranged in a matrix structure. Each of the plurality of pixel blocks 110 may have a shared pixel structure. Each of the plurality of pixel blocks 110 may include a light receiving section 210 which generates photocharges in response to incident light, a driving circuit 290 which generates and outputs an output signal Vout corresponding to the photocharges generated by the light receiving section 210, and an intercoupling section 240 which electrically couples the light receiving section 210 and the driving circuit 290. The driving circuit 290 may include a first driving section 220 which includes a reset transistor Rx and a second driving section 230 which includes a driver transistor Dx. Since detailed descriptions for each pixel block 110 were made above with reference to FIGS. 1 and 2, further descriptions thereof will be omitted herein.

The pixel array 100 of the image sensor in accordance with the first embodiment are arranged such that any pixel block is disposed adjacent to any other pixel block in the first direction D1 and/or the second direction D2. For example, a first pixel block 110-1 may be disposed adjacent to a second pixel block 110-2 in the first direction D1. Further, the first pixel block 110-1 and the second pixel block 110-2 may be disposed adjacent to a third pixel block 110-3 and a fourth pixel block 110-4, respectively, in the second direction D2.

The pixel blocks 110 which are positioned on the same lines in the third direction D3 and the fourth direction D4 may have the same planar shape to each other. For example, the first pixel block 110-1 and the fourth pixel block 110-4 are positioned on the same line in the third direction D3. Thus, the planar shape of the first pixel block 110-1 may be the same as the planar shape of the fourth pixel block 110-4. Also, the second pixel block 110-2 and the third pixel block 110-3 are positioned on the same line in the fourth direction D4. Thus, the planar shape of the second pixel block 110-2 may be the same as the planar shape of the third pixel block 110-3. Any pixel blocks 110 which are positioned on the same line in the first direction D1 or the second direction D2 may have different planar shapes from each other. For example, the first pixel block 110-1 and the second pixel block 110-2, which are positioned on the same line in the first direction D1, have different planar shapes from each other and the first pixel block 110-1 and the third pixel block 110-3, which are positioned on the same line in the second direction D2, have different planar shapes from each other. Therefore, the pixel array 100 may have a shape in which two pixel blocks 110 having different planar shapes from each other are alternately disposed in the first direction D1 and the second direction D2. The pixel blocks 100 with two different planar shapes can avoid or reduce the occurrence of fixed pattern noise (FPN) and thus can prevent characteristic deterioration due to fixed pattern noise. In addition, it is possible to prevent differences in output signals outputted from unit pixels for a color, for example, green.

A first driving section 220-1 of the first pixel block 110-1 and a first driving section 220-2 of the second pixel block 110-2 may be disposed adjacent to each other, and a pickup region 291 may be positioned between them. In this regard, the first pixel block 110-1 and the second pixel block 110-2 may share one pickup region 291. Thus, the pickup region 291 may be positioned at a boundary where the first pixel block 110-1 and the second pixel block 110-2 adjoin each other. As the pickup region 291 is shared, the size, in particular, the channel area, of pixel transistors may be increased within a limited area. Through this, characteristic deterioration due to temporary noise can be prevented.

With respect to the boundary where the first pixel block 110-1 and the second pixel block 110-2 adjoin each other, the first driving section 220-1 of the first pixel block 110-1 may have a shape symmetrical to the first driving section 220-2 of the second pixel block 110-2. This symmetrical arrangement helps to prevent characteristic deterioration due to fixed pattern noise. For example, while a first unit pixel 211 of the first pixel block 110-1 and a first unit pixel 211 of the second pixel block 110-2 are the same position in the unit of pixel block 110, because adjacent pixel transistors are different from each other, characteristic deterioration due to fixed pattern noise may be prevented.

In addition, since the first driving section 220-1 of the first pixel block 110-1 and the first driving section 220-2 of the second pixel block 110-2 have symmetrical shapes, drains D of reset transistors Rx may be positioned at both sides, respectively, of the pickup region 291. As a reset voltage Vrst is supplied to the drains D of the reset transistors Rx and the pickup region 291 is positioned to be adjacent to the drains D of the reset transistors Rx, operational stability may be improved.

With respect to the boundary where the first pixel block 110-1 and the second pixel block 110-2 adjoin each other, a second driving section 230-1 of the first pixel block 110-1 and a second driving section 230-2 of the second pixel block 110-2 are arranged to be apart from each other due to the existence of the first driving sections 220-1 and 220-2 of the first and second pixel blocks 110-1 and 110-2. In some implementations, the second driving section 230-1 of the first pixel block 110-1 may have a shape asymmetrical to the second driving section 230-2 of the second pixel block 110-2. is the arrangement of the second driving sections 230-1 and 230-2 are designed to prevent driver transistors Dx from being disposed adjacent to each other between adjacent pixel blocks 110. In particular, this is to prevent drains D of the driver transistors Dx which are applied with a driver voltage Vdri, from being disposed adjacent to each other. Besides, this is to prevent driver gates DG coupled to floating diffusions FD from being disposed adjacent to each other. Through this, interference between the second driving section 230-1 of the first pixel block 110-1 and the second driving section 230-2 of the second pixel block 110-2 may be prevented, and characteristic deterioration due to temporary noise may be effectively prevented. Moreover, the operation characteristics of the driver transistors Dx may be improved.

For reference, in the case where the drains D of the driver transistors Dx which are applied with the driver voltage Vdri in the first pixel block 110-1 and the second pixel block 110-2 are disposed adjacent to each other, noise may be generated by interference due to an electric field effect, and operation characteristics may deteriorate. In order to prevent this, a pickup region should be additionally formed between the drains D of adjacent driver transistors Dx, and the size of pixel transistors may decrease due to the added pickup region. In the case where driver gates DG are disposed adjacent to each other, operation characteristics may deteriorate by interference due to coupling of them. However, in the case where the second driving section 230-1 of the first pixel block 110-1 and the second driving section 230-2 of the second pixel block 110-2 have asymmetrical shapes as in the present first embodiment, problems likely to be caused in the case where the drains D of the driver transistors Dx are disposed adjacent to each other may be solved.

The third pixel block 110-3 and the fourth pixel block 110-4 have an arrangement of the second driving sections 230-3 and 230-4 different from the second driving sections 230-1 and 230-2 of the first pixel block 110-1 and the second pixel block 110-2. The second driving section 230-3 of the third pixel block 110-3 and the second driving section 230-4 of the fourth pixel block 110-4 may be disposed adjacent to each other. With respect to a boundary where the third pixel block 110-3 and the fourth pixel block 110-4 adjoin each other, the second driving section 230-3 of the third pixel block 110-3 may have a shape asymmetrical to the second driving section 230-4 of the fourth pixel block 110-4. This is to prevent driver transistors Dx from being disposed adjacent to each other between adjacent pixel blocks 110-3 and 110-4.

With respect to the boundary where the third pixel block 110-3 and the fourth pixel block 110-4 adjoin each other, a first driving section 220-3 of the third pixel block 110-3 may have a shape symmetrical to a first driving section 220-4 of the fourth pixel block 110-4. This is to prevent characteristic deterioration due to fixed pattern noise.

As described above, in the image sensor in accordance with the first embodiment, since the first driving section 220-1 of the first pixel block 110-1 and the first driving section 220-2 of the second pixel block 110-2 have symmetrical shapes and the second driving section 230-1 of the first pixel block 110-1 and the second driving section 230-2 of the second pixel block 110-2 have asymmetrical shapes, noise generation and characteristic deterioration due to a shared pixel structure may be prevented.

FIG. 4 is a top view illustrating a representation of an example of a portion of a pixel array of an image sensor in accordance with a second embodiment.

Referring to FIGS. 1, 2 and 4, the image sensor in accordance with the second embodiment may include a pixel array 100 in which a plurality of pixel blocks 110 are arranged in a matrix structure. Each of the plurality of pixel blocks 110 may have a shared pixel structure. Each of the plurality of pixel blocks 110 may include a light receiving section 210 which generates photocharges in response to incident light, a driving circuit 290 which generates and outputs an output signal Vout corresponding to the photocharges generated by the light receiving section 210, and an intercoupling section 240 which electrically couples the light receiving section 210 and the driving circuit 290. The driving circuit 290 may include a first driving section 220 which includes a reset transistor Rx and a second driving section 230 which includes a driver transistor Dx. Since detailed descriptions for each pixel block 110 were made above with reference to FIGS. 1 and 2, further descriptions thereof will be omitted herein.

The pixel array 100 of the image sensor in accordance with the second embodiment are arranged such that any pixel array is disposed adjacent to other pixel arrays in the first and second directions D1 and D2. For example, a first pixel block 110-1 may be disposed adjacent to a second pixel block 110-2 in the first direction D1. Further, the first pixel block 110-1 and the second pixel block 110-2 may be disposed adjacent to a third pixel block 110-3 and a fourth pixel block 110-4, respectively, in the second direction D2.

The pixel blocks 110 which are positioned on the same lines in the third direction D3 and the fourth direction D4 may have the same planar shape as the first pixel block 110-1. For example, the planar shape of the first pixel block 110-1 may be the same as the planar shape of the fourth pixel block 110-4. Also, the pixel blocks 110 which are positioned on the same lines as the second pixel block 110-2 in the third direction D3 and the fourth direction D4 may have the same planar shape as the second pixel block 110-2. For example, the planar shape of the second pixel block 110-2 may be the same as the planar shape of the third pixel block 110-3. When the pixel blocks which are positioned on the same lines in the first direction D1 and the second direction D2 have different shapes from each other, the pixel array 100 may have a shape in which two kinds of pixel blocks 110 having different planar shapes are alternately disposed in the first direction D1 and the second direction D2. Through this, characteristic deterioration due to fixed pattern noise may be prevented.

With the present second embodiment, with respect to a boundary where a first pixel block 110-1 and a second pixel block 110-2 adjoin each other, a first driving section 220-1 of the first pixel block 110-1 may have a shape symmetrical to a first driving section 220-2 of the second pixel block 110-2. This is to prevent characteristic deterioration due to fixed pattern noise.

The first driving section 220-1 of the first pixel block 110-1 and the first driving section 220-2 of the second pixel block 110-2 may be disposed adjacent to each other. In third regard, the first driving section 220-1 of the first pixel block 110-1 and the first driving section 220-2 of the second pixel block 110-2 may have shapes which share a drain D of reset transistors Rx to which a reset voltage Vrst is applied. Through this, it is possible to increase the size, in particular, the channel area, of pixel transistors within a limited area, and characteristic deterioration due to temporary noise may be prevented.

With respect to the boundary where the first pixel block 110-1 and the second pixel block 110-2 adjoin each other, a second driving section 230-1 of the first pixel block 110-1 and a second driving section 230-2 of the second pixel block 110-2 are arranged to be apart from each other due to the existence of the first driving sections 220-1 and 220-2 of the first and second pixel blocks 110-1 and 110-2. In some implementations, the second driving section 230-1 of the first pixel block 110-1 may have a shape asymmetrical to the second driving section 230-2 of the second pixel block 110-2. This is to prevent driver transistors Dx from being disposed adjacent to each other between adjacent pixel blocks 110.

Pickup regions 291 may be positioned adjacent to a second driving section 230-1 of the first pixel block 110-1 and a second driving section 230-2 of the second pixel block 110-2, respectively. For example, pickup regions 291 are positioned on outer sides of the second driving section 230-1 of the first pixel block 110-1 and a second driving section 230-2 of the second pixel block 110-2, respectively. In detail, the pickup regions 291 may be positioned to be adjacent to drains D of driver transistors Dx to which a driver voltage Vdri is applied. Since the first pixel block 110-1 and the second pixel block 110-2 have shapes which share the drain D of the reset transistors Rx, the pickup regions 291 may be disposed adjacent to the drains D of the driver transistors Dx. Through this, it is possible to effectively improve operational stability.

The third pixel block 110-3 and the fourth pixel block 110-4 have an arrangement of the second driving sections 230-3 and 230-4 different from the second driving sections 230-1 and 230-2 of the first pixel block 110-1 and the second pixel block 110-2. The second driving section 230-3 of the third pixel block 110-3 and the second driving section 230-4 of the fourth pixel block 110-4 may be disposed adjacent to each other, and a pickup region 291 may be positioned between them. For example, the pickup region 291 which is formed adjacent to the drain D of the driver transistor Dx of the fourth pixel block 110-4 may be shared with the third pixel block 110-3. Thus, the pickup region 291 may be positioned at a boundary where the third pixel block 110-3 and the fourth pixel block 110-4 adjoin each other. As the pickup region 291 is shared, the size, in particular, the channel area, of pixel transistors may be increased within a limited area. Through this, characteristic deterioration due to temporary noise may be prevented.

With respect to the boundary where the third pixel block 110-3 and the fourth pixel block 110-4 adjoin each other, the second driving section 230-3 of the third pixel block 110-3 may have a shape asymmetrical to the second driving section 230-4 of the fourth pixel block 110-4. This is to prevent driver transistors Dx from being disposed adjacent to each other between adjacent pixel blocks 110.

With respect to the boundary where the third pixel block 110-3 and the fourth pixel block 110-4 adjoin each other, a first driving section 220-3 of the third pixel block 110-3 may have a shape symmetrical to a first driving section 220-4 of the fourth pixel block 110-4. This is to prevent characteristic deterioration due to fixed pattern noise.

As described above, in the image sensor in accordance with the second embodiment, since the first driving section 220-1 of the first pixel block 110-1 and the first driving section 220-2 of the second pixel block 110-2 have symmetrical shapes and the second driving section 230-1 of the first pixel block 110-1 and the second driving section 230-2 of the second pixel block 110-2 have asymmetrical shapes, noise generation and characteristic deterioration due to a shared pixel structure may be prevented.

Figure 5:
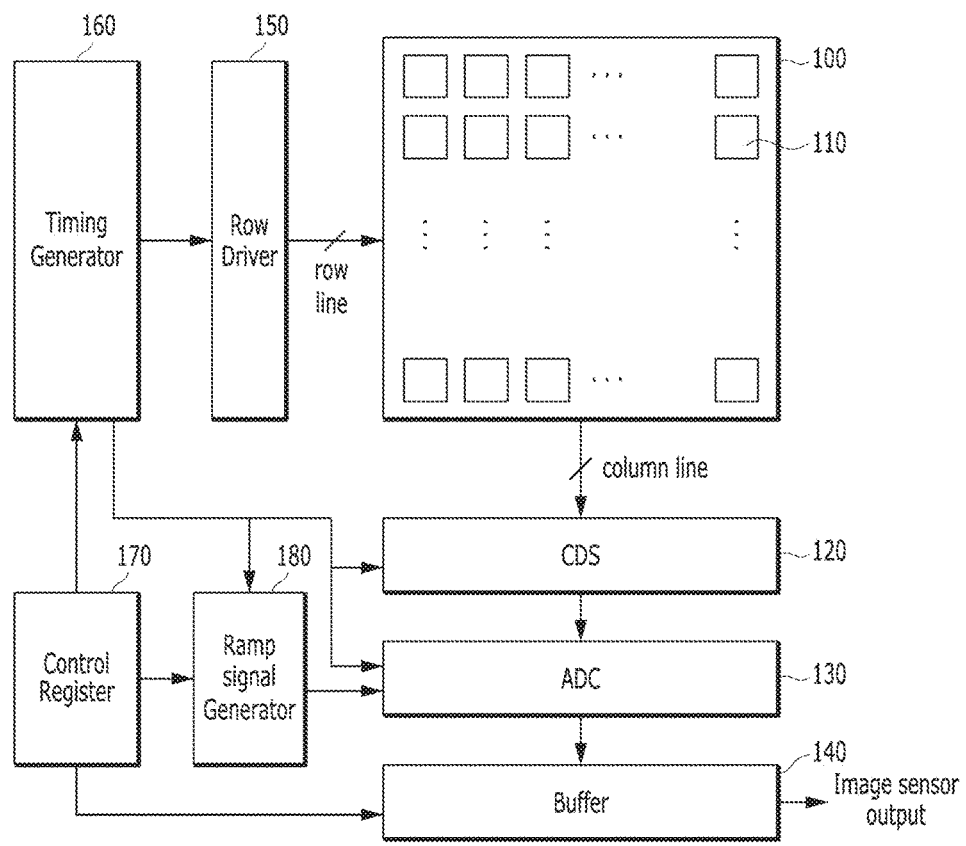
FIG. 5 is a block diagram schematically illustrating a representation of an example of an image sensor based on an embodiment of the disclosed technology.

FIG. 5 is a block diagram schematically illustrating a representation of an example of an image sensor based on an embodiment of the disclosed technology.

As shown in FIG. 5, the image sensor may include a pixel array 100, a correlated double sampling (CDS) 120, an analog-digital converter (ADC) 130, a buffer 140, a row driver 150, a timing generator 160, a control register 170, and a ramp signal generator 180. The plurality of pixel groups 110 may be arranged in a matrix structure. Each of the plurality of pixel groups 110 may have a 4-shared pixel structure.

The timing generator 160 generates one or more control signals for controlling the respective operations of the row driver 150, the correlated double sampling (CDS) 120, the analog-digital converter (ADC) 130 and the ramp signal generator 180. The control register 170 generates one or more control signals for controlling the respective operations of the ramp signal generator 180, the timing generator 160 and the buffer 140.

The row driver 150 is coupled to the pixel array 100 through a row line. The row driver 150 drives the pixel array 100 with the row line. For example, the row driver 150 may generate a select signal for selecting a particular row line among a plurality of row lines. The plurality of row lines are coupled with the plurality of pixel groups 110, respectively. One row line is coupled to each of the plurality of pixel groups 110.

The correlated double sampling 120 is coupled to the pixel array 150 through column lines. Each of the plurality of pixel groups 110 senses incident light, and outputs an image reset signal and an image signal to the correlated double sampling 120 through a column line. The correlated double sampling 120 performs sampling for each of the image reset signal and the image signal that are received from the pixel array 100. The plurality of pixel groups 110 are coupled to a plurality of column lines, respectively. One column line is coupled to each of the plurality of pixel groups 110. The analog-digital converter 130 is coupled with the correlated double sampling 120 and the ramp signal generator 180. The analog-digital converter 130 is configured to receive a sampling signal and a ramp signal from the correlated double sampling 120 and the ramp signal generator 180, respectively, compare the ramp signal which is outputted from the ramp signal generator 180 with the sampling signal which is outputted from the correlated double sampling 120, and output a comparison signal. In some implementations, the analog-digital converter 130 is coupled to the timing generator 160 which provides a clock signal to the analog-digital converter 130. The analog-digital converter 130 counts a level transition time of the comparison signal using the clock signal which is provided from the timing generator 160, and outputs a count value to the buffer 140. In some implementations, the timing generator is further coupled to the ram signal generator 180 and the ramp signal generator 180 may operate under the control of the timing generator 160.

The buffer 140 is coupled to the analog-digital converter 130 to receive digital signals from the analog-digital converter 130. In some implementations, the buffer 140 may include a memory (not shown) and a sense amplifier (not shown). The buffer 140 stores digital signals which are outputted from the analog-digital converter 130. In some implementations, the memory of the buffer 140 stores the count values that are counted by and provided from the analog-digital converter 130. The count values may be associated with the signals outputted from the plurality of pixel groups 110. The buffer 140 is further configured to sense and amplify the stored digital signals, and outputs the amplified resultant signals. The sense amplifier of the buffer 140 is structured to sense and amplify the respective count values which are outputted from the memory.

The image sensor in accordance with the above-described embodiments can be used in various electronic devices or systems. Hereafter, a case in which the image sensor in accordance with the embodiments is applied to a camera will be described with reference to FIG. 6.

Figure 6:
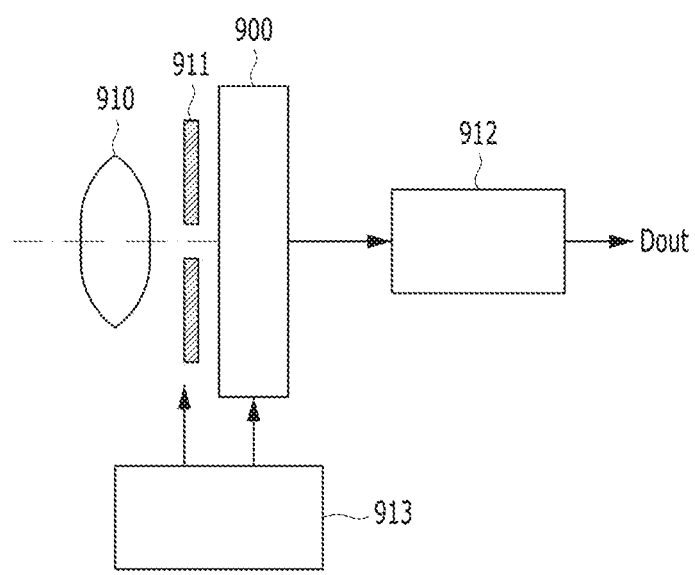
FIG. 6 is a diagram schematically illustrating a representation of an example of an electronic device including an image sensor based on an embodiment of the disclosed technology.

FIG. 6 is a diagram schematically illustrating a representation of an example of an electronic device including the image sensor based on an embodiment of the disclosed technology.

Referring to FIG. 6, the electronic device including the image sensor based on the embodiment of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to a pixel array (see the reference numeral 100 of FIG. 5) of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or others.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and illustrated in this patent document.

What is claimed is:

1. An image sensor comprising:
  a pixel array in which a plurality of pixel blocks are arranged,
    each of the plurality of pixel blocks comprising:
      a light receiving section including a plurality of unit pixels which share a floating diffusion;
      a first driving section disposed at one side of the light receiving section and including a reset transistor; and
      a second driving section disposed adjacent to the first driving section and including a driver transistor,
    wherein the plurality of pixel blocks include a first pixel block and a second pixel block which is adjacent to the first pixel block, and, with respect to a boundary where the first pixel block and the second pixel adjoin each other, the first driving section of the first pixel block has a shape symmetrical to the first driving section of the second pixel block and the second driving section of the first pixel block has a shape asymmetrical to the second driving section of the second pixel block.

2. The image sensor according to claim 1, wherein the first driving section of the first pixel block and the first driving section of the second pixel block are arranged closer to the boundary than the second driving section of the first pixel block and the second driving section of the second pixel block, respectively, and the image sensor further comprises:
  a pickup region positioned between the first driving section of the first pixel block and the first driving section of the second pixel block and supplied with a ground voltage.

3. The image sensor according to claim 2, wherein drains of reset transistors which are supplied with a reset voltage are positioned at both sides, respectively, of the pickup region.

4. The image sensor according to claim 1, wherein the first driving section of the first pixel block and the first driving section of the second pixel block are positioned adjacent to each other, and are structured to share a drain for reset transistors which is supplied with a reset voltage.

5. The image sensor according to claim 4, further comprising:
  pickup regions positioned adjacent to the second driving section of the first pixel block and the second driving section of the second pixel block, respectively, and supplied with a ground voltage, the pickup regions being adjacent to drains of driver transistors supplied with a driver voltage.

6. The image sensor according to claim 1, wherein each of the plurality of pixel blocks further comprises:
  an intercoupling section disposed to electrically couple the floating diffusion and a source of the reset transistor and electrically couplie the floating diffusion and a gate of the driver transistor.

7. The image sensor according to claim 6, wherein a contact between the gate of the driver transistor and the intercoupling section is formed within a predetermined range and as far as possible from a drain of the driver transistor which is supplied with a driver voltage.

8. The image sensor according to claim 6, wherein in each of the plurality of pixel blocks,
the source of the reset transistor which is coupled with the intercoupling section is positioned inside a drain of the reset transistor which is supplied with a reset voltage.

9. The image sensor according to claim 1,
wherein pixel blocks positioned on oblique lines crossing the first pixel block have the same planar shape as the first pixel block, and
wherein pixel blocks positioned on oblique lines crossing the second pixel block have the same planar shape as the second pixel block.

10. An image sensor comprising:
a pixel array in which a plurality of pixel blocks are arranged,
each of the plurality of pixel blocks comprising:
a light receiving section including a plurality of unit pixels which share a floating diffusion;
a first driving section disposed at one side of the light receiving section and including a reset transistor; and
a second driving section disposed adjacent to the first driving section and including a driver transistor,
wherein the plurality of pixel blocks include a first pixel block, a second pixel block which is adjacent to the first pixel block in a first direction, and a third pixel block and a fourth pixel block which are adjacent to the first pixel block and the second pixel block, respectively, in a second direction intersecting with the first direction,
wherein, with respect to a first boundary where the first pixel block and the second pixel block adjoin each other, the first driving section of the first pixel block has a shape symmetrical to the first driving section of the second pixel block and is positioned adjacent to the first driving section of the second pixel block, and
wherein, with respect to a second boundary where the third pixel block and the fourth pixel block adjoin each other, the second driving section of the third pixel block has a shape asymmetrical to the second driving section of the fourth pixel block and is positioned adjacent to the second driving section of the fourth pixel block.

11. The image sensor according to claim 10, wherein, with respect to the first boundary, the second driving section of the first pixel block has a shape asymmetrical to the second driving section of the second pixel block, and
wherein, with respect to the second boundary, the first driving section of the third pixel block has a shape symmetrical to the first driving section of the fourth pixel block.

12. The image sensor according to claim 10, further comprising:
a pickup region positioned between the first driving section of the first pixel block and the first driving section of the second pixel block, and supplied with a ground voltage.

13. The image sensor according to claim 12, wherein drains of reset transistors which are supplied with a reset voltage are positioned at both sides, respectively, of the pickup region.

14. The image sensor according to claim 10, wherein the first driving section of the first pixel block and the first driving section of the second pixel block are structured to share a drain for reset transistors which is supplied with a reset voltage.

15. The image sensor according to claim 14, further comprising:
pickup regions positioned adjacent to the second driving section of the first pixel block and the second driving section of the second pixel block, respectively, and supplied with a ground voltage, the pickup regions being adjacent to drains of driver transistors which are supplied with a driver voltage.

16. The image sensor according to claim 10, wherein each of the plurality of pixel blocks further comprises:
an intercoupling section disposed to electrically couple the floating diffusion and a source of the reset transistor and electrically couple the floating diffusion and a gate of the driver transistor.

17. The image sensor according to claim 16, wherein a contact between the gate of the driver transistor and the intercoupling section is formed within a predetermined range and as far as possible from a drain of the driver transistor which is supplied with a driver voltage.

18. The image sensor according to claim 16, wherein in each of the plurality of pixel blocks,
the source of the reset transistor which is coupled with the intercoupling section is positioned inside a drain of the reset transistor which is supplied with a reset voltage.

19. The image sensor according to claim 10,
wherein pixel blocks positioned on oblique lines crossing the first pixel block have the same planar shape as the first pixel block, and
wherein pixel blocks positioned on oblique lines crossing the second pixel block have the same planar shape as the second pixel block.

20. The image sensor according to claim 10, wherein the planar shape of the first pixel block is the same as the planar shape of the fourth pixel block, and the planar shape of the second pixel block is the same as the planar shape of the third pixel block.

* * * * *